US012135362B2

(12) United States Patent
Daval-Frerot et al.

(10) Patent No.: US 12,135,362 B2
(45) Date of Patent: Nov. 5, 2024

(54) B0 FIELD INHOMOGENEITY ESTIMATION USING INTERNAL PHASE MAPS FROM LONG SINGLE ECHO TIME MRI ACQUISITION

(71) Applicants: Siemens Healthineers AG, Forchheim (DE); Commissariat a l Energie Atomique et aux Energies Alternatives, Paris (FR)

(72) Inventors: Guillaume Daval-Frerot, Sainte-Geneviève-des-Bois (FR); Aurelien Massire, Palaiseau (FR); Mathilde Ripart, Seraincourt (FR); Boris Mailhe, Plainsboro, NJ (US); Mariappan S. Nadar, Plainsboro, NJ (US); Alexandre Vignaud, Paris (FR); Philippe Ciuciu, Longpont-sur-Orge (FR)

(73) Assignees: Siemens Healthineers AG, Forchheim (DE); Commissariat a l Energie Atomique et aux Energies Alternatives, Paris (FR)

( * ) Notice: Subject to any disclaimer, the term of this patent is extended or adjusted under 35 U.S.C. 154(b) by 805 days.

(21) Appl. No.: 17/245,993

(22) Filed: Apr. 30, 2021

(65) Prior Publication Data
US 2022/0189081 A1    Jun. 16, 2022

Related U.S. Application Data

(60) Provisional application No. 63/124,911, filed on Dec. 14, 2020.

(51) Int. Cl.
*G01R 33/48*    (2006.01)
*G01R 33/24*    (2006.01)
(Continued)

(52) U.S. Cl.
CPC ....... *G01R 33/4824* (2013.01); *G01R 33/243* (2013.01); *G01R 33/445* (2013.01); *G01R 33/5608* (2013.01); *G01R 33/56563* (2013.01)

(58) Field of Classification Search
CPC ............... G01R 33/243; G01R 33/445; G01R 33/4824; G01R 33/5608; G01R 33/56563
See application file for complete search history.

(56) References Cited

U.S. PATENT DOCUMENTS 10,145,929 B2 * 12/2018 Stemmer .............. G01R 33/243
10,234,521 B2 *  3/2019 Liu .................. G01R 33/56563
(Continued)

FOREIGN PATENT DOCUMENTS

| JP | 2002306445 | 10/2002 |
|----|------------|---------|
| JP | 2006255046 | 9/2006  |
| JP | 2018205080 | 12/2018 |

OTHER PUBLICATIONS

Haacke EM, Xu Y, Cheng YC, Reichenbach JR. Susceptibility Weighted Imaging (SWI). Magnetic Resonance in Medicine 2004; 52 (3): 612-18.

(Continued)

*Primary Examiner* — Gregory H Curran (57) ABSTRACT

A magnetic resonance (MR) image may be created from MR data by receiving the MR data, applying a transform to the MR data, where a result of the applying is an image space representation of the MR data, determining a wrapped phase map of the image space representation of the MR data, obtaining an unwrapped phase map based on the wrapped phase map, scaling the unwrapped phase map into a B0 field map, reconstructing the MR image based on the MR data, correcting the MR image based on the B0 field map, and outputting the MR image. The scaling may be free of (Continued)

accounting for effects on the MR data by artifact sources secondary to B0 field inhomogeneities.

19 Claims, 6 Drawing Sheets

(51) Int. Cl.
  *G01R 33/44* (2006.01)
  *G01R 33/56* (2006.01)
  *G01R 33/565* (2006.01)

(56) References Cited

U.S. PATENT DOCUMENTS

2017/0038446 A1 2/2017 Liu et al.
2018/0017652 A1* 1/2018 Ye .................. G01R 33/56545

OTHER PUBLICATIONS

Sutton, BP, Noll DC, and Fessler JA. Fast, Iterative Image Reconstruction for MRI in the Presence of Field Inhomogeneities. IEEE Transactions on Medical Imaging 2003;22 (2): 178-88.
Dymerska B, Poser BA, Barth M, Trattnig S, Robinson SD. A Method for the Dynamic Correction of B0-Related Distortions in Single-Echo EPI at 7T. NeuroImage, Neuroimaging with Ultra-high Field MRI: Present and Future, 2018; 168: 321-31.
Sutton, Bradley P., Douglas C. Noll, and Jeffrey A. Fessler. 2004. "Dynamic Field Map Estimation Using a Spiral-in/Spiral-out Acquisition." Magnetic Resonance in Medicine 51 (6): 1194-1204.
Man, Lai-Chee, John M. Pauly, and Albert Macovski. 1997. "Improved Automatic Off-Resonance Correction without a Field Map in Spiral Imaging." Magnetic Resonance in Medicine 37 (6): 906-13.
Patzig F, Wilm B, Gross S, Brunner D, Pruessmann KP. 2020. "Off-Resonance Self-Correction for Single-Shot Imaging". ISMRM 2020, abstract #3400.
Le Ster C, Mauconduit F, Mirkes C, Bottlaender M, Boumezbeur F, Djemai B, Vignaud A, Boulant N. RF Heating Measurement Using MR Thermometry and Field Monitoring: Methodological Considerations and First in Vivo Results. Magnetic Resonance in Medicine 2020.
Van de Moortele PF, Pfeffer J, Glover GH, Ugurbil K, Hu X. Respiration-Induced B0 Fluctuations and Their Spatial Distribution in the Human Brain at 7 Tesla. Magnetic Resonance in Medicine 2002; 47 (5): 888-95.
Lier A, Brunner DO, Pruessmann KP, Klomp D, Luijten PR, Lagendijk J, Berg C. B1+ Phase Mapping at 7 T and Its Application for in Vivo Electrical Conductivity Mapping. Magnetic Resonance in Medicine 2012; 67 (2): 552-61.
Parker DL, Payne A, Todd N, Hadley JR. Phase Reconstruction from Multiple Coil Data Using a Virtual Reference Coil. Magnetic Resonance in Medicine 2014; 72 (2): 563-69.
Setsompop K. Design Algorithms for Parallel Transmission in Magnetic Resonance Imaging. 2009.
Ghiglia DC, Romero LA. Robust Two-Dimensional Weighted and Unweighted Phase Unwrapping That Uses Fast Transforms and Iterative Methods. JOSA A 1994; 11: 107-17.
Walsh, David O., Arthur F. Gmitro, and Michael W. Marcellin. "Adaptive reconstruction of phased array MR imagery." Magnetic Resonance in Medicine: An Official Journal of the International Society for Magnetic Resonance in Medicine 43.5 (2000): 682-690.
Karsa, Anita, and Karin Shmueli. "SEGUE: A speedy region-growing algorithm for unwrapping estimated phase." IEEE transactions on medical imaging 38.6 (2018): 1347-1357.
Schofield, Marvin A., and Yimei Zhu. "Fast phase unwrapping algorithm for interferometric applications." Optics letters 28.14 (2003): 1194-1196.
EESR in EP patent application No. 21214253.3, dated Apr. 26, 2022, 12 pages.
Daval-Fréot, Guillaume et al: "Off-resonance correction of non-cartesian SWI using internal field map estimation"; Proceedings of The 2021 ISRAM & SMRT Annual Meeting & Exhibition, May 15-20, 2021, ISRM, 2030 Addison Street, 7th Floor, Berkeley, CA 9704 USA; No. 3551, Apr. 30, 2021 (Apr. 30, 2021); xp040725568.
Lingala, Sajan Goud et al: "Improved spiral dynamic MRI of vocal tract shaping at 3 Tesla using dynamic off resonance artifact correction"; Proceddings of the International Society for Agnetic Resonance in Medicine, ISRAM, 27th Annual Meeting and Exhibition, May 11-16, 2019; No. 44, Apr. 26, 2019 (Apr. 26, 2019), pp. 1-4, XP040707828.
Rauscher, Alexander et al: "Improved elimination of phase effects from background field inhomogeneities for susceptibility weighted imaging at high magnetic field strengths"; Magnetic Resonance Imaging, Elsevir Science, Tarrytown, NY, US; vol. 26, No. 8, Oct. 1, 2008 (Oct. 1, 2008), pp. 1145-1151, XP025431190.
Lim, Yongwan, et al. "Dynamic off-resonance correction for spiral real-time MRI of speech." Magnetic resonance in medicine 81.1 (2019): 234-246.

* cited by examiner

B0 FIELD INHOMOGENEITY ESTIMATION USING INTERNAL PHASE MAPS FROM LONG SINGLE ECHO TIME MRI ACQUISITION

PRIORITY CLAIM

This application claims priority to U.S. provisional application Ser. No. 63/124,911, filed Dec. 14, 2020, which is entirely incorporated by reference.

FIELD

The following disclosure relates to estimating B0 field inhomogeneity for magnetic resonance imaging (MRI).

BACKGROUND

Magnetic resonance imaging (MRI) may be used to acquire images of a patient. However, the quality of the images obtained may suffer due to various artifacts. For example, inhomogeneities in a magnetic field (e.g. the B0 field) may cause distortion and blurring artifacts. The artifacts may increase in severity when an echo time (TE) of the image acquisition increases.

Image quality may be improved by correcting the artifacts. For example, by understanding the influence of the inhomogeneities in the B0 field, the artifacts caused by the inhomogeneities may be reduced. In some cases, a B0 field map may be acquired in addition to the patient images and used to correct the artifacts. These approaches may be error prone and require multiple full scans, increasing an already long examination time. The increased examination time may be shortened by reducing the resolution of the scan and, thereby, the resolution of the B0 field map, resulting in poor error correction performance.

SUMMARY

By way of introduction, the preferred embodiments described below include methods and systems for estimating B0 field inhomogeneity. A single acquisition is used to estimate the B0 field inhomogeneity in high resolution, reducing the time for acquisition and avoiding sources of error.

In a first aspect, a method for creating a magnetic resonance (MR) image from MR data includes receiving, by a processor, the MR data, applying, by the processor, a transform to the MR data, wherein a result of the applying is an image space representation of the MR data, determining, by the processor, a wrapped phase map of the image space representation of the MR data, obtaining, by the processor, an unwrapped phase map based on the wrapped phase map, scaling, by the processor, the unwrapped phase map into a B0 field map, the scaling based on only the influence of B0 field inhomogeneities on phases in the MR data, reconstructing, by the processor, the MR image based on the MR data, correcting, by the processor, the MR image based on the B0 field map, and outputting, by the processor, the MR image.

The method may include applying, by the processor, a virtual coil combination method to the image space representation of the MR data. The wrapped phase map may be determined based on the virtual coil combination method applied to the image space representation of the MR data. The method may include determining, by the processor, a magnitude image based on the image space representation of the MR data. The method may include applying, by the processor, a sum of squares operation to the image space representation of the MR data. The determining of the magnitude image may be based on the sum of squares operation applied to the image space representation of the MR data. The obtaining of the unwrapped phase map may be based on the magnitude image. The method may include generating, by the processor, a mask image based on the magnitude image and applying, by the processor, the mask image to the B0 field map. The contribution of heating, motion, radio frequency pulse heterogeneities, coil sensitivities and eddy current, or a combination thereof to the phases in the MR data is unrepresented in the scaling. The MR data may be received from a clinical acquisition, and the correcting of the MR image may be based on the B0 field map of only the clinical acquisition. The scaling of the unwrapped phase map may be based on an approximation of the B0 field map as $\Delta B0 = \varphi/2\pi\, TE$. The MR data may be obtained from a non-Cartesian acquisition. The MR data may be obtained with an echo time of at least 20 ms, a field strength of approximately 3 T, or a combination thereof. The method may further include applying, by the processor, a low-pass filter to the B0 field map, the low-pass filter removing signals beyond a frequency domain of the B0 field inhomogeneities. The transform may be a non-uniform transform.

In a second aspect a medical imaging system includes a magnetic resonance (MR) imager, a processor, and a memory. The memory stores instructions that, when executed, are operable to receive MR data from the MR imager, apply a transform to the MR data, where a result of the applying is an image space representation of the MR data, determine a wrapped phase map of the image space representation of the MR data, obtain an unwrapped phase map based on the wrapped phase map, scale the unwrapped phase map into a B0 field map, the scaling disregarding effects on the MR data by artifact sources secondary to B0 field inhomogeneities, reconstruct the MR image based on the MR data, correct the MR image based on the B0 field map, and output the MR image.

The memory of the system may store instructions operable to apply a virtual coil combination method to the image space representation of the MR data. The wrapped phase map is determined based on the virtual coil combination method applied to the image space representation of the MR data. The memory of the system may store instructions operable to determine a magnitude image based on the image space representation of the MR data. The memory of the system may store instructions operable to apply a sum of squares operation to the image space representation of the MR data. The magnitude image is determined based on the sum of squares operation applied to the image space representation of the MR data. The unwrapped phase map is obtained based on the magnitude image. The memory of the system may store instructions operable to generate a mask image based on the magnitude image and apply the mask image to the B0 field map.

In a third aspect, a non-transitory computer-readable medium stores processor-executable process steps, the process steps executable by a processor to cause a system to receive clinical MR data from the MR imager, apply a transform to the clinical MR data, where a result of the applying is an image space representation of the clinical MR data, determine a wrapped phase map of the image space representation of the MR data, obtain an unwrapped phase map based on the wrapped phase map, scale the unwrapped phase map into a B0 field map according to a linear relationship between B0 and echo time, reconstruct the MR image based on the clinical MR data, correct the MR image based on the B0 field map, and output the MR image.

The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE DRAWINGS AND PRESENTLY PREFERRED EMBODIMENTS

Patient-induced inhomogeneities in the B0 magnetic field may cause artifacts such as distortions and blurring during image acquisitions. The artifacts may be more pronounced for acquisitions with long echo times, for example, as in susceptibility-weighted imaging (SWI) and/or T2*gradient echo (GRE) imaging.

SWI may be used in high resolution brain venography (e.g. to diagnose traumatic brain injuries) due to greater sensitivity to venous blood. Long echo times (e.g. 20-40 ms) may be used with SWI to highlight susceptibility information. However, SWI data acquired with long echo times may include amplified off-resonance artifacts, such as geometric distortions and image blurring. Correcting the off-resonance artifacts may allow for greater adoption of SWI.

Further, the artifacts are accumulated over readout directions by affecting the imaging gradients over time. For non-Cartesian sampling patterns (such as those that may be used with SWI and/or T2*GRE), the accumulation increases the severity of artifacts in the data. The non-Cartesian sampling patterns allow for better spatial resolution and faster acquisitions, for example, when used with compressed-sensing reconstruction. Correcting the artifacts may allow for greater adoption of the non-Cartesian sampling patterns.

In some cases, the artifacts caused by the inhomogeneities may be corrected based on information about the B0 field. Some methods of correcting the artifacts include determining a B0 field map ($\Delta B0$) via an additional low-resolution MR acquisition in addition to the primary clinical acquisition for the patient, requiring two volumetric acquisitions overall with different echo times.

The following formulas may be used to determine $\Delta B0$ from the phase maps ($\varphi 1$ and $\varphi 2$) in each voxel of the two volumes acquired with different echo times (e.g. TE1 and TE2, with TE1>TE2):

$$\varphi 1 = \varphi 0 + 2\pi \times \Delta B0 \times TE1$$

$$\varphi 2 = \varphi 0 + 2\pi \times \Delta B0 \times TE2$$

reducing to $$\Delta B0 = (\varphi 1 - \varphi 2)/(2\pi \times (TE1 - TE2))$$

The $\varphi 0$ term gathers the effects on the phase of other sources beyond the B0 field, such as heating, motion, radio frequency pulse heterogeneities, coil sensitivities and eddy current. The B0 field map shows the inhomogeneities in the B0 field, allowing for artifacts caused by the inhomogeneities to be corrected. However, the additional acquisition increases the total examination time for a patient. Additionally, this method is prone to errors in the correction if the patient moves between the B0 field map acquisition and the clinical acquisitions.

By approximating the B0 field map based on a single echo acquisition only (e.g. just the acquisition of the patient), the additional acquisition may be avoided and/or examination time may be reduced. The B0 field map may be approximated based on solely the phase image from a single acquisition (e.g. a SWI acquisition). In the case that two acquisitions are used to determine the B0 field map, the second acquisition is lower resolution. Using a single acquisition to estimate the B0 field map benefits from high spatial resolution, robustness to inter-scan motion, and minimal impact on image reconstruction time.

In some cases, the $\Delta B0$ field map may be estimated from the clinical acquisition to avoid the additional acquisition. For example, gradient-based methods or grid-search methods may be used. However, such methods suffer from poor estimation of the B0 field, poor correction performance, and long estimation times.

Another method of estimating the B0 field map from the clinical acquisition may be based on the principle that a main component of the observed phase (from the single acquisition) may be linearly related to $\Delta B0$ and TE. In some cases, the relative impact of non-$\Delta B0$ terms (e.g. sources of error secondary to the B0 field inhomogeneities, such as heating, motion, radio frequency pulse heterogeneities, coil sensitivities and eddy current) may be insignificant. In cases of long echo-time, secondary sources contributing to the phase maps may be considered as negligible compared to the contribution induced by B0 inhomogeneities. For example, for acquisitions at a magnetic field strength of 3 T and an echo time of greater than or equal to 20 ms. Such conditions may be suitable for SWI acquisitions. An estimated B0 field map, produced at 0.6 mm isotropic, is estimated in under 3 minutes, from a single acquisition may provide similar performance for artifact correction compared to B0 field maps determined from a secondary acquisition. Thus, the acquisition used for reconstructing and forming an image of the patient for diagnosis or clinical purposes is also used for estimating the B0 field map.

As noted above, the $\varphi 0$ term gathers the artifact effects caused by secondary sources, such as heating, motion, radio frequency pulse heterogeneities, coil sensitivities and eddy current. For example, eddy currents may be weak for well-designed and/or calibrated MR scanners. Because these secondary sources of artifacts may be ignored for certain imaging parameters (e.g. for long TE at intermediate magnetic field strength), the B0 field map may be approximated as $$\Delta B0 = \varphi / 2\pi TE.$$

Further sources of image artifacts, such as bulk motion, may be, in some cases, non-negligible and may be corrected by other techniques beyond B0 field map correction. Image artifacts caused by RF field emission and reception may be limited and correctable separately, respectively. Overall, these contributions to the φ0 term may be about 15-20 times lower than 2π TE ΔB0 (the effect of B0 field inhomogeneities), for example, at 3 T with TE of at least 20 ms. Accordingly, the φ0 term may be removed, and the approximation of the B0 field map may proceed accordingly.

Approximating the B0 field map without consideration of the φ0 term may provide significant benefits to medical professionals, patients, and hospitals. For example, the approximated B0 field map may be obtained without any additional acquisition with similar performance as determining the B0 field map from two acquisitions. In one example, a B0 field map may be determined from two acquisitions in 2 min, 43 s, whereas a B0 field map may be approximated from a single clinical acquisition in 2 min, 55 s. Further, the approximated B0 field map may produce image corrections similar to the corrections obtained with a B0 field map determined from two acquisitions (for example, as shown FIG. 5). Still further, the approximated B0 field map resolution is the same as the corresponding acquisition, allowing for higher fidelity corrections as compared to the dual-acquisition B0 field map. Using a dual-acquisition method to determine a high-resolution B0 field map may even more significantly extend the acquisition time. In fact, the tradeoff between resolution and acquisition time for dual-acquisition B0 field map determination leads to significantly lower resolution B0 field maps in practice and, accordingly, poorer artifact correction for image reconstruction. Using a single acquisition to approximate the B0 field map, as disclosed herein, improves upon each of these aspects.

In one application, medical imaging scanners and reconstruction workflows may use the single-acquisition method to provide a retrospective B0 field approximation to correct previous image acquisitions where no B0 field correction was performed at the time of clinical acquisition. This application may provide significant benefits for sequences sensitive to ΔB0 artifacts acquired with a long echo time, but where ΔB0 are/were not acquired at the time of clinical imaging.

Figure 1:
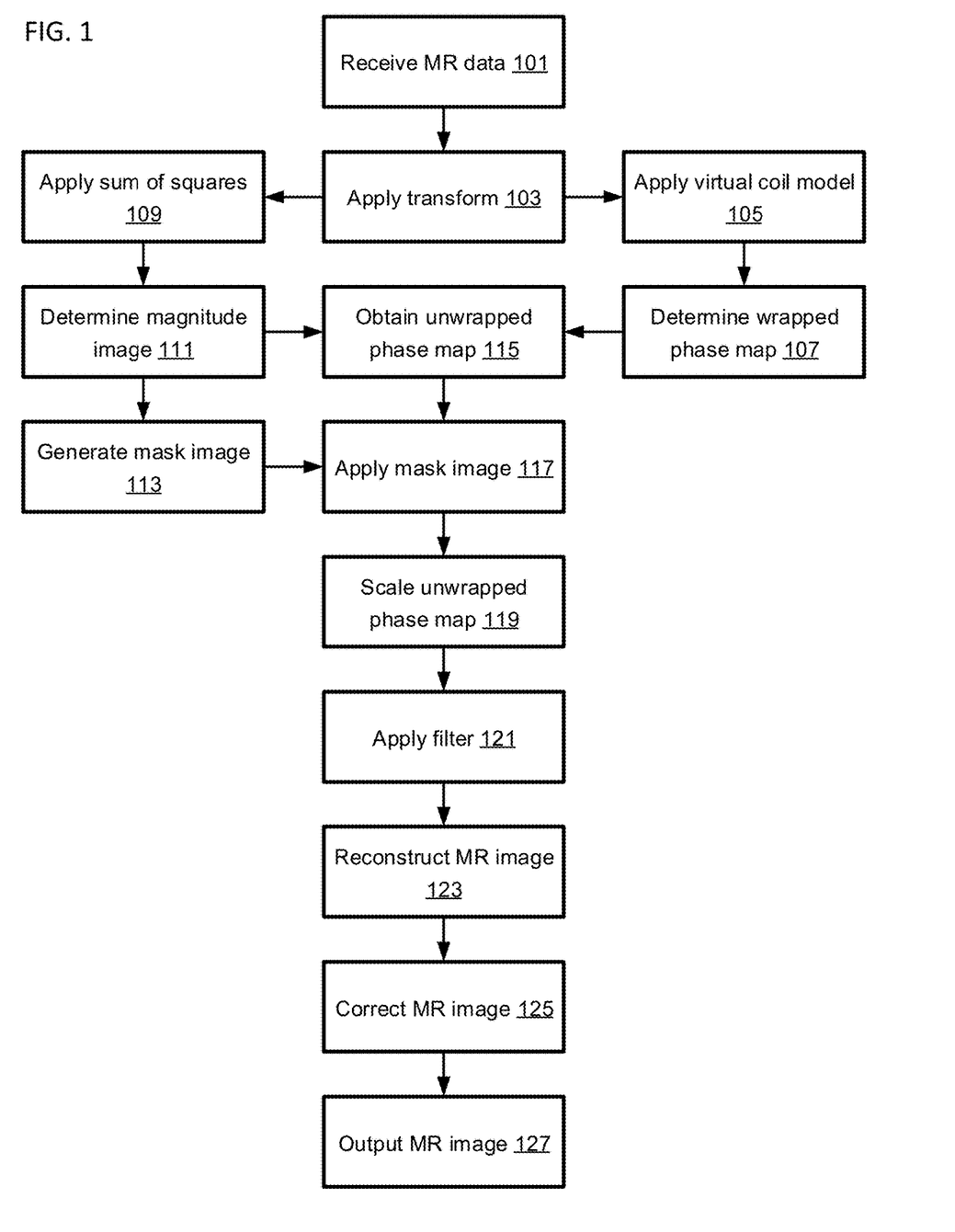
FIG. 1 illustrates one embodiment of a method for creating a magnetic resonance (MR) image.

FIG. 1 illustrates a method for creating a magnetic resonance image. More, fewer, or different acts may be performed. In some cases, one or more of acts 109, 111, 113, and/or 121 may be omitted. The acts may be performed in a different order than shown. For example, acts 107 and/or 111 may proceed directly from act 103. In another example, act 119 may proceed directly from act 115. In a further example, act 123 may proceed directly from act 119. In still another example, act 121 may be performed as part of or proceed directly from act 103. A processor coupled to a memory may be configured to perform one or more of the acts. For example, the processor 603 and memory 605 of FIG. 6 may be configured to perform one or more of the acts of FIG. 1. Additional, different, or alternative aspects of the acts may be described below with respect to FIG. 2.

In act 101, MR data is received. The MR data may be received from a medical imager, such as a MR imaging device. The MR data may be generated during a clinical MR acquisition, as opposed to an additional acquisition performed to determine a B0 field map. The clinical acquisition may be an acquisition with parameters suitable for imaging patient tissue. For example, the clinical acquisition may have a longer echo time than a subsequent acquisition to observe the B0 field. In this way the B0 field map may be approximated based on only the clinical acquisition MR data, instead of multiple acquisitions. The MR data may be k-space data, such as the k-space data 201 of FIG. 2.

In some cases, the MR data may be acquired according to a SWI or other long echo time (e.g., 20 ms or greater) process. The MR data may be acquired in Cartesian or non-Cartesian coordinates. In one example, the MR data may be obtained with an echo time of at least 20 ms and/or a field strength of approximately 3 T. In another example, the echo time may be 30 ms. In a further example, the field strength may be less than 3 T, such as 1.5 T. In yet another example, the field strength may be greater than 3 T, such as 7 T.

In act 103, an adjoint transform is applied to the MR data (e.g. the adjunct transform 203). The transform may receive as an input k-space MR data. The result of applying the transform is an image space representation of the MR data. In one example, the transform is a non-uniform fast Fourier transform (NUFFT). Other transforms used in reconstructing object or image space from k-space may be used.

In act 105, a virtual coil combination method is applied to the image-space transform or representation of the MR data (e.g. the combination 205). The virtual coil combination method may be applied when an array of coils is used for MR signal reception of the MR data. In one case, a wrapped phase map (e.g. the wrapped phase map 207) determined in act 107 may be determined based on the virtual coil combination method. In some other cases, a different combination method may be used to determine a wrapped phase map from the image space representation of the MR data. The virtual coil combination method describes the behavior of MR coils used to acquire the MR data. In this way, the virtual coil combination method allows for information on the phase of the magnetic resonance signals to be obtained from the image space representation. A wrapped phase map determined from the image space representation (e.g. with the application of the virtual coil combination method or another combination method) may collect or represent the phase information. The wrapped phase may be referred to as "wrapped" because the phase of the signals is constrained to the range of e.g. −π to +π. In the wrapped phase map, when a measured phase value is outside of the range, the value is modified to fit within the range. A result of wrapping the phase information within the range is shown by the sharp local contrast bands in the phase maps of FIGS. 2, 3, and 4.

In a case that a single coil is used to acquire the MR data, the wrapped phase map may be determined directly from the MR data. For example, the wrapped phase map may be obtained without an application of a combination method, such as the virtual coil combination method.

In act 109, a sum of squares technique (e.g. the technique 209) is applied to the image-space representation of the MR data. In one case, the magnitude image (e.g. the magnitude image 211) determined in act 111 may be based on the sum of squares technique or another technique applied to the image space representation of the MR data. The magnitude image represents or shows the strength of the MR signal received from voxels of the MR data acquisition. In this way, the magnitude image shows another aspect of the image space representation of the MR data in addition to the wrapped phase map.

In act 113, a mask image (e.g. the mask image 213) is generated based on the magnitude image. The mask image may remove portions of the imagine volume irrelevant to or unwanted in a clinical assessment and/or a correction of the reconstructed image. For example, where brain tissue or vasculature are of particular interest, the mask image may remove portions of the MR data representing extraneous objects, such as bones of the skull.

In act 115, an unwrapped phase map is generated (e.g. by the unwrapping 215). The unwrapped phase map may be obtained based on at least the wrapped phase map and, in some cases the wrapped phase map and the magnitude image. For example, the wrapped phase map may be unwrapped by solving a Poisson equation weighted by the magnitude of the image previously estimated. By solving the Poisson equation, the phase values unconstrained to e.g. the $-\pi$ to $+\pi$ range may be determined. Because the unwrapping process determines the phase values as unconstrained to the specified range, local and global variance in phase may be shown more accurately and at greater detail. The unconstrained phase values allow for accurate correction based on a resultant B0 field map.

In act 117, the mask image is applied to the phase unwrapped phase map (e.g. during or as part of the unwrapping 215). Applying the mask image to the unwrapped phase map may remove unwanted or irrelevant portions of the unwrapped phase map. In this way, the magnitude image (the basis of the mask image) may be used to focus the phase information used to create the B0 field map.

In act 119, the unwrapped phase map is scaled to obtain a B0 field map (e.g. the B0 field map 221). The scaling may proceed, for example, as described with respect to the scaling 217. As discussed above, artifacts in the MR data may be caused by B0 field inhomogeneities and secondary sources. However, by focusing only on the contribution of B0 field inhomogeneity to the MR data artifacts, the B0 field map may be determined based on a linear relationship between a phase value for a voxel of the MR data and an echo time of the clinical acquisition. Based on the echo time, each voxel may be "scaled" according to the phase value for the voxel, giving a local value for the B0 field at the voxel. The B0 field value at a voxel may be determined according to $B0 = \varphi/2\pi$ TE. The B0 field map may be determined by combining the local B0 value for each voxel (or, at least the voxels of interest).

In act 121, a filter is applied (e.g. proceeding as described with respect to the filtering 219) to the B0 field map. The filter may be, for example, a low-pass filter. The filter may remove contributions to the MR data from susceptibility in the B0 field map while preserving contributions to the MR data from B0 field inhomogeneities. For example, the contributions from susceptibility may be distributed in one section of a spectral domain, and the filter may remove such susceptibility contributions while removing signals outside of the section of the domain. By removing the contributions from susceptibility in the B0 field map, the susceptibility will be present in the corrected image as only the contributions from the B0 inhomogeneities will be removed from the reconstructed image.

Figure 2:
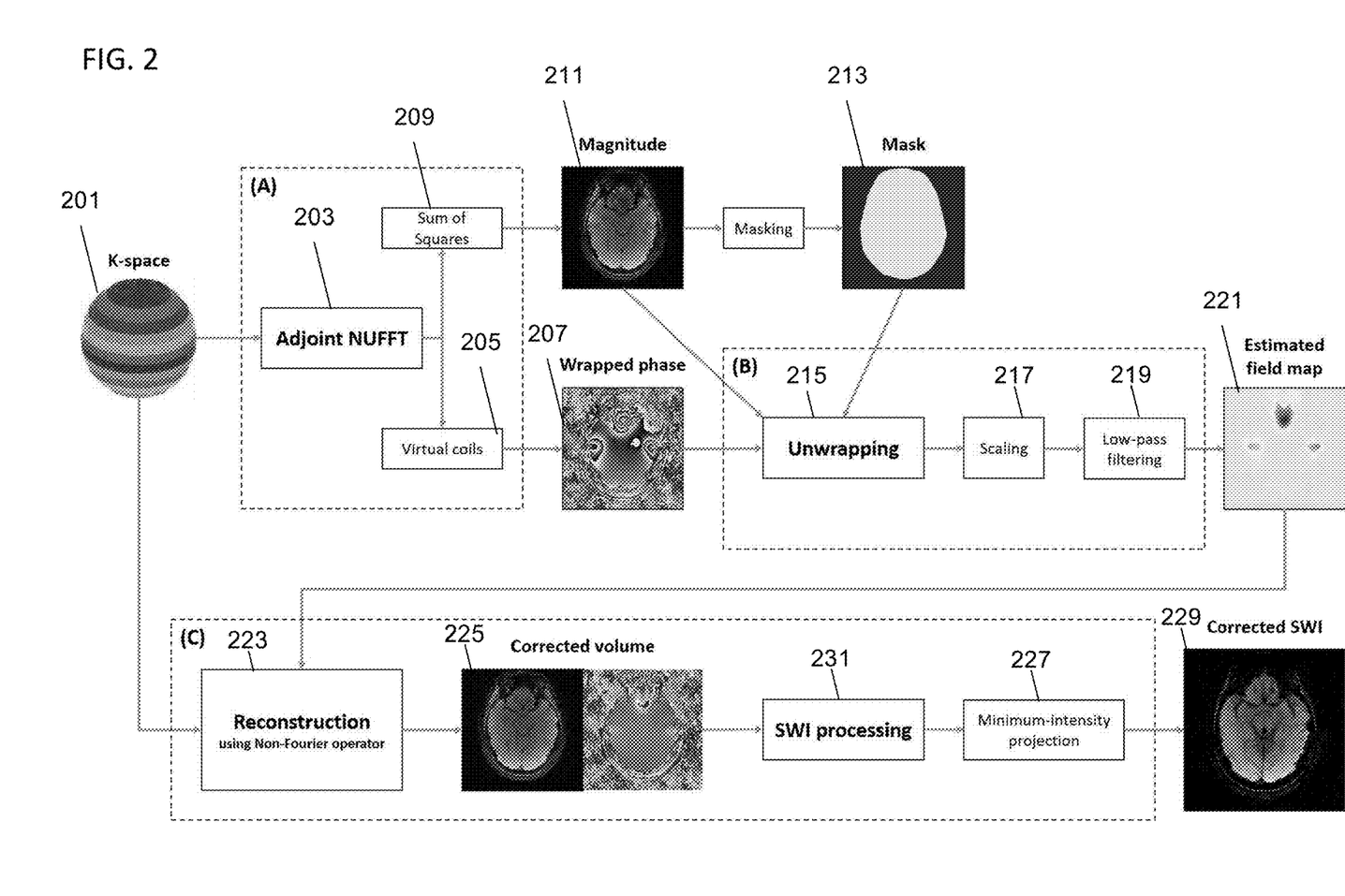
FIG. 2 illustrates an embodiment of a flowchart for reconstructing an image with a correction based on a B0 field map.

In act 123, a MR image is reconstructed from the MR data (e.g. according to the reconstruction of section C of FIG. 2 and/or the reconstruction 223). An image reconstruction process may proceed from the k-space MR data, the same MR data used to estimate the B0 field map. A transform, such as a non-Fourier operator, may be used to bring the k-space data into image space. The reconstructed image may suffer from artifacts from various sources, such as the B0 field inhomogeneity. The artifacts may be corrected by applying the B0 field map to the reconstructed image, as in act 125. The output of the correction may be, for example, the corrected volume 225. The local B0 field value at a voxel may be used to weight the magnetic intensity of the reconstructed image at the same voxel. Through the weighting, the observed values at a voxel may be scaled to remove the impact of a non-uniform B0 field throughout the imaging volume.

Figure 6:
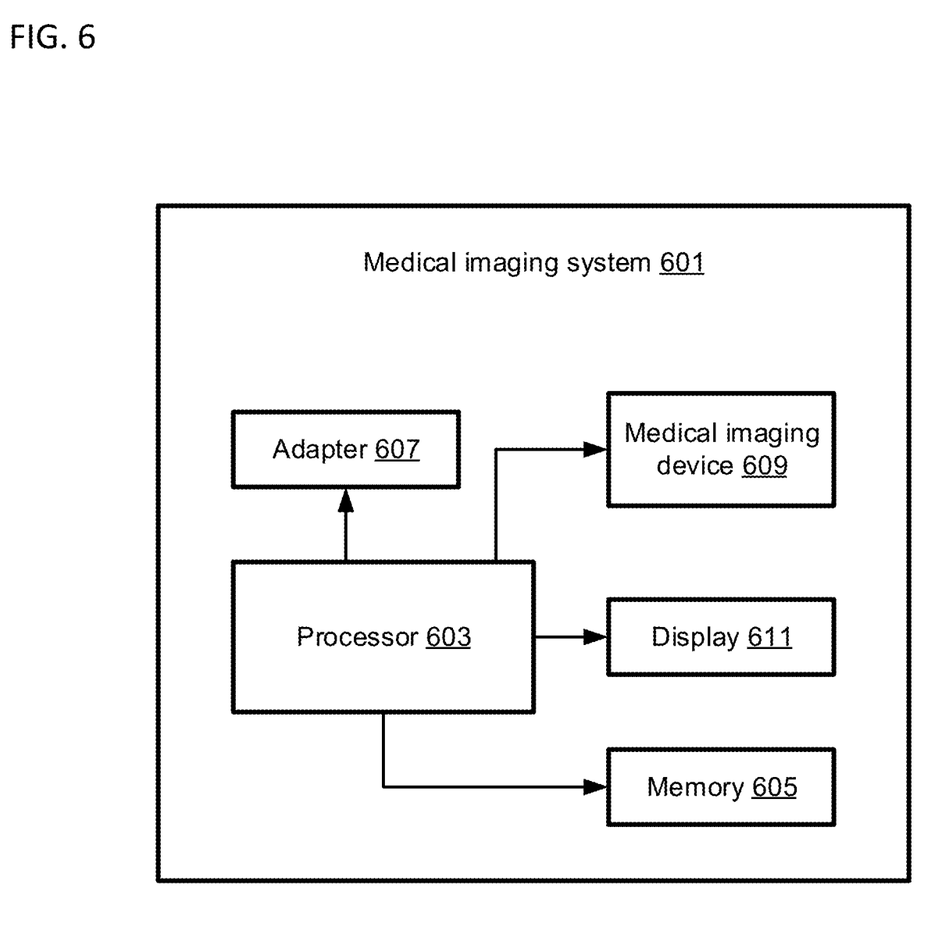
FIG. 6 illustrates an embodiment of a system for medical imaging.

In act 127, the MR image is output. The MR image may be output to one or more destinations. For example, the MR image may be sent to a storage device (such as the memory 605 or another repository), an MR system, and/or a display (such as the display 611). The reconstructed MR image may be reformatted, such as reconstructing a volume and volume rendering an image from the reconstructed volume.

FIG. 2 illustrates a flowchart for reconstructing an image with a correction based on a B0 field map. The acts of FIG. 1 may describe additional, different, or alternative aspects of the acts of FIG. 2. In section A, a phase map is obtained from the k-space data 201 from a clinical MR acquisition. In section B, the phase map is scaled and, in some cases, filtered to approximate a B0 field map expressing the inhomogeneities of the B0 field during the acquisition. In section C, an image (e.g. a three-dimensional image) is reconstructed from the MR data and corrected based on the approximated B0 field map.

The k-space data 201 (e.g. MR data from a clinical acquisition) is received, for example, as described with respect to act 101. Starting in section A, a magnitude image 211 and/or a wrapped phase map 207 are obtained by computing an adjoint 203 of density-compensated k-space data 201, for example, as described with respect to one or more of acts 103, 105, 107, 109, and/or 111. Though an adjoint NUFFT 203 is shown, other transforms (such as Discrete Fourier Transforms, Fast Fourier Transforms, Partial (Fast) Fourier Transforms) may be used. Further, though a virtual coil combination method 205 and a sum of squares operation 209 are shown, other combination methods (such as adaptive coil combination or sensitivity maps) for coil channels in the MR data, and other operations, respectively, may be used.

In section B, the estimated or approximated B0 field map 221 is produced by unwrapping 215, scaling 217, and/or low-pass filtering 219. Through unwrapping 215, an unwrapped phase map is determined from the wrapped phase map 207, for example, as described with respect to act 115. The wrapped phase map may be unwrapped 215 by solving a Poisson equation weighted by the magnitude of the image 211 previously estimated. The magnitude image 211 and associated mask 213 estimated with the adjoint 203 are used to weight and stabilize the phase unwrapping algorithm 215. Though the unwrapping act 215 in section B receives as input the wrapped phase map 207, the magnitude image 211, and, in some cases, the mask image 213, alternative unwrapping techniques 215 may be used. In one case, an unwrapping technique 215 may be used that unwraps the wrapped phase map without using the magnitude image 211 and/or mask image 213. For example, a Laplacian method or a Speedy rEgion-Growing Algorithm for Unwrapping Estimated Phase (SEGUE) method may be applied to unwrap the wrapped phase map 207.

The unwrapped phase map may be scaled 217 linearly based on the relationship between a B0 value for a voxel, the phase value for the voxel, and the echo time of the k-space data 201 acquisition. For example, the B0 field value for a voxel may be determined according to $B0 = \varphi/2\pi$ TE. A low-pass filter 219, such as a Hanning filter may be applied to the scaled B0 field map to filter out high frequencies. The low-pass filter 219 may prevent suppression of the susceptibility contributions to the MR data in a reconstructed and corrected image 225 that are the subject of SWI. The resulting approximation of the B0 field map 221 may be used to correct artifacts in an image reconstructed from the k-space data 201.

In section C, an image is reconstructed 223 based on the k-space MR data 201. The reconstruction 223 may proceed as described with respect to act 123. In one case, a non-Fourier operator is used to reconstruct the MR image from the k-space MR data 201. However, the reconstructed image may be subject to artifacts. The artifacts may be corrected by applying, in an image space, the estimated B0 field map 221, such as the B0 field map estimated according to one or more acts of FIG. 1. After correction, a corrected imaging volume 225 is obtained.

For SWI, additional steps 231 may be performed on the corrected volume 225 to get a SW image. For example, based on the corrected volume 225 a further phase image may be determined, for example, as described with respect to acts 103, 105, and 107 of FIG. 1, and elements 203, 205, and 207 of FIG. 2. A filter may be applied to the further phase image to remove low frequencies (e.g. as described with respect to act 121 and element 219), retaining high frequency contributions to the phase image due to susceptibility. A mask may be created from the filtered further phase image based on multiplying voxel values (e.g. by a factor of 4 to 5), and then apply the mask to a magnitude image of the corrected volume 225. Though this process, SWI images are obtained.

A minimum-intensity projection 227 may be applied to the filtered further phase image determined from the corrected imaging volume 225 via the processing step 231 to create a corrected SW image 229.

In one example, the acts of sections A and B are performed to estimate a B0 field map 221 without accounting for any contributions to image artifacts from sources beyond B0 field inhomogeneities. In this example, the B0 field map is approximated in under 3 min: adjoint computation completed in 127 s, coil combination via the virtual coil combination method completed in 31 s, creating the mask from the magnitude image completed in 5 s, and phase unwrapping, filtering, and scaling together completed in 12 s.

Figure 3:
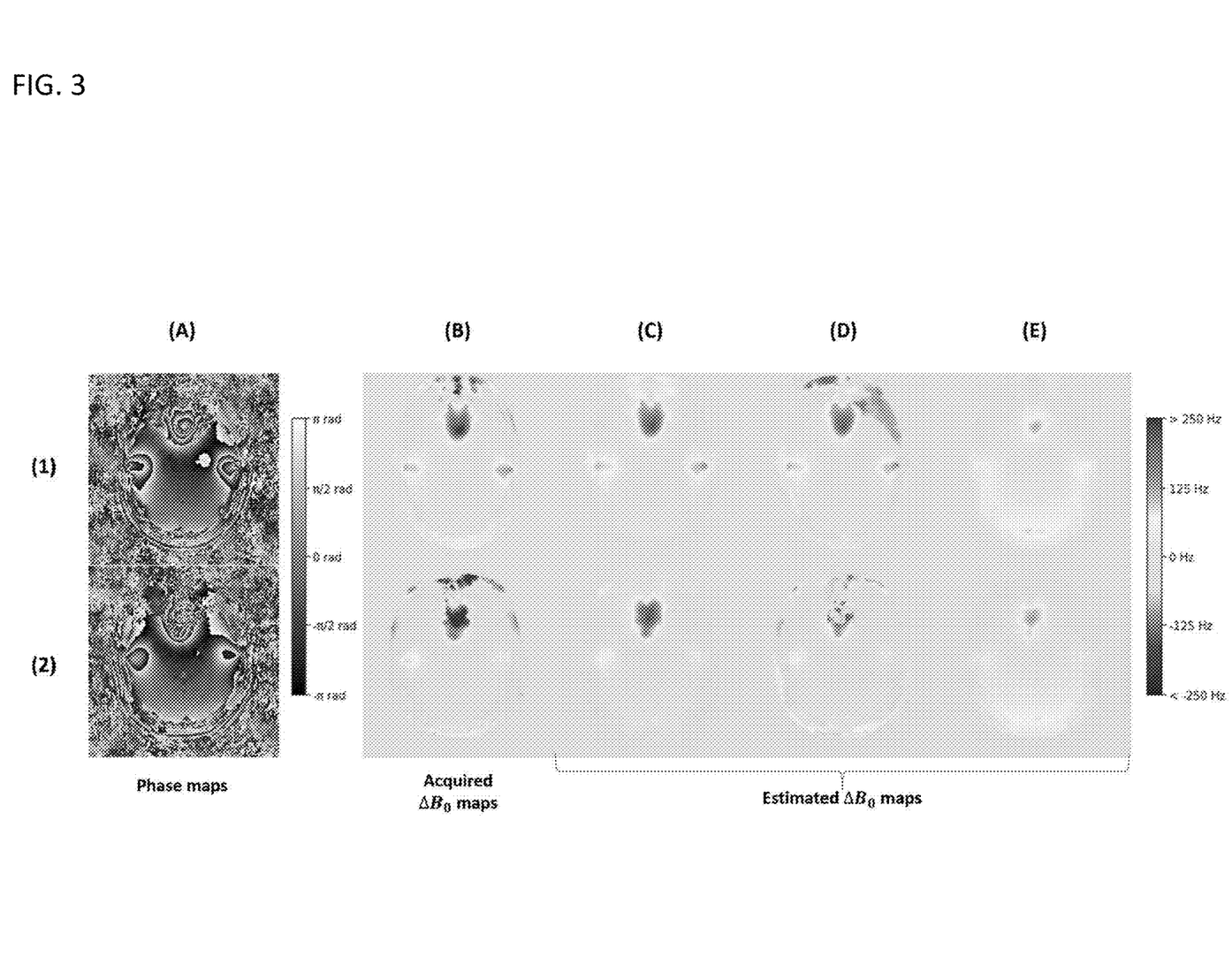
FIG. 3 illustrates example phase maps and B0 field maps.
Figure 4:
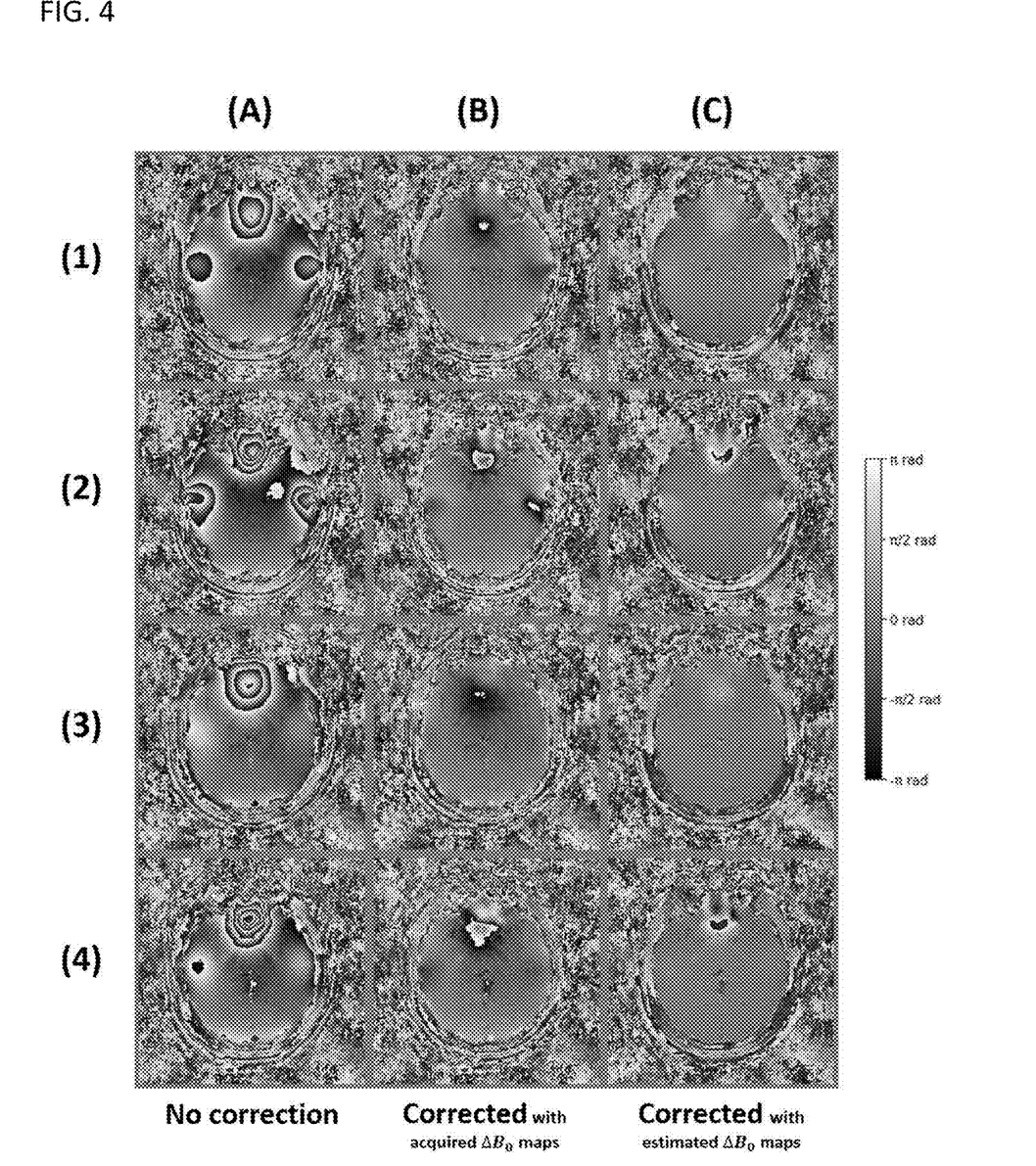
FIG. 4 illustrates example different phase maps.
Figure 5:
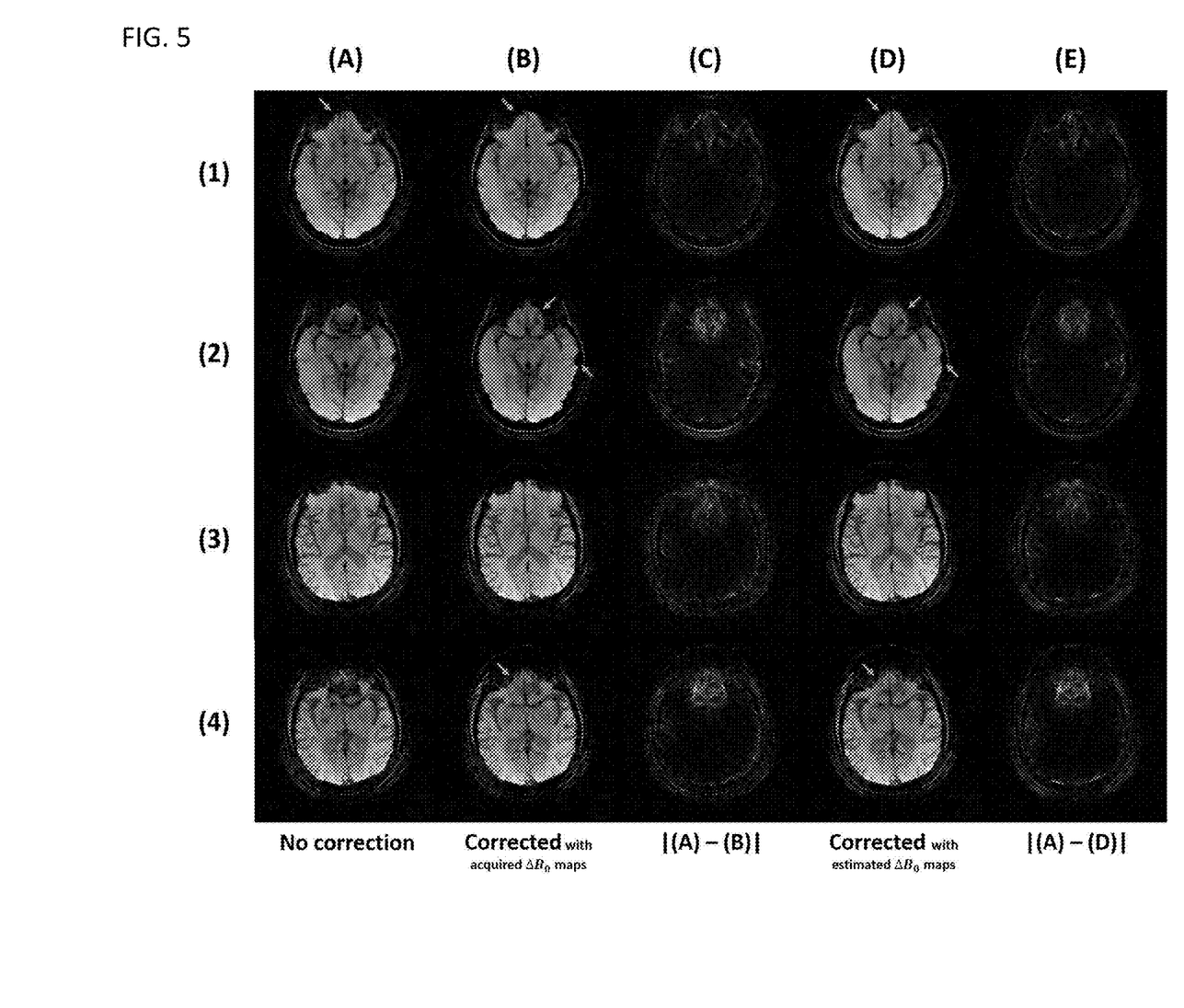
FIG. 5 illustrates examples of different susceptibility weighted images.

FIGS. 3, 4, and 5 illustrate examples of and comparisons between phase maps, acquired B0 field maps, estimated B0 field maps, and images corrected according to the B0 field maps. In the examples of FIGS. 3, 4, and 5, MR data was acquired as a SWI image volume for two volunteers at 3 T (using a (Siemens Healthineers PrismaFIT, Erlangen, Germany), with a 64-channel head/neck coil array, and using a 3D Spherical Stack-of-SPARKLING sampling pattern. The MR data was acquired with the following parameters: acquisition time (TA): 5 min, 0.6 mm isotropic resolution, field of view (FOV): 240 mm, slice number: 208, TE: 20 ms, relaxation time (TR): 50 ms, Bw: 33 Hz/px. An additional reference B0 field map was acquired with the following parameters: TA: 2 min 43 s, FOV 240 mm, 2 mm isotropic resolution, TE1: 4.92 ms, TE2: 7.38 ms. The reference B0 field map serves as a baseline against which the performance of the single-acquisition B0 field map may be compared.

Image reconstructions (e.g. for the images shown in FIG. 4) are performed iteratively in 3D, with a soft thresholding regularization in the wavelet domain. A correcting non-Fourier operator is used with a pre-computed density compensation. The channels are re-combined using sum-of-squares (e.g. as described with respect to acts 109 and/or 111) and virtual coils (e.g. as described with respect to acts 105 and/or 107). Reconstructions are performed without correction, and with correction, using either acquired or estimated field maps. SWI minimum-intensity projection is applied over 16 mm. All post-processing is performed using a 2560-core Quadro P5000 GPU and 16 GB of GDDR5 VRAM.

In FIG. 3, images are shown relating to each of the two patients across rows 1 and 2. Column A shows phase maps, column B shows a B0 phase map based on a dual-acquisition method, and columns C, D, and E show B0 field maps estimated from a single clinical acquisition Of the B0 maps in columns C, D, and E, are estimated according to different unwrapping algorithms, for example, the different unwrapping techniques discussed with respect to act 115 and element 215. The estimated B0 maps in column C, using an unwrapping technique based on at least the wrapped phase map 207 and the magnitude image 211 show improved performance for error correction over the B0 maps of columns D and E.

In FIG. 4, the phase maps in rows 1, 2, 3, and 4 correspond to the images in rows 1, 2, 3, and 4 in FIG. 5. Column A of FIG. 4 shows SW images without correction, corresponding to the images in column A of FIG. 5. Column B of FIG. 4 shows SW images corrected with the reference B0 field map, and column C shows SW images corrected with the estimated B0 field map.

In FIG. 5, rows 1, 2, 3, and 4 show different SW images reconstructed from MR data. Column A shows images without any artifact correction applied and column B shows images acquired with the reference B0 field map (e.g. a B0 field map determined from dual-acquisitions). Column C shows an absolute difference between the images in columns A and B so that the extent of the correction for the baseline B0 field map is observable. Column D shows images corrected using a B0 field map estimated from just the clinical acquisition, and column E shows an absolute difference between the images in columns A and D so that the extent of the correction for the estimated B0 field map is observable. The arrows in FIG. 5 highlight delicate features in the SW images that are present in the images in columns A, B, and D.

As may be seen from FIG. 3 (e.g. columns B, C, D, and E), the unwrapping (e.g. performed as described with respect to act 115) provides greater consistency at inner regions of the B0 field map as compared to the acquired B0 field map. However, the phase maps shown in column B of FIG. 4 (e.g. as compared to the phase maps shown in column C of FIG. 4) suggest that the B0 values of the acquired B0 field maps are too high because the phase is wrapped negatively (starting from a center, the phase values decrease to $-\pi$ until the phase values are wrapped to $+\pi$). A result is an over-compensation of the effects of inhomogeneities. The estimated B0 field maps used for the corrected images shown in column C of FIG. 4 produce better compensations. The resulting SW images in FIG. 5 show a similar correction between the reference B0 map (shown in column C of FIG. 5) and the proposed B0 field map approximation technique (shown in column E of FIG. 5).

In the case of long echo times (e.g. greater than or equal to 20 ms) at intermediate field (e.g. at 3 T), a single phase image (determined from a single clinical acquisition) can be used to quickly and efficiently estimate a B0 field map, enabling corrections of off-resonance artifacts with performance similar to corrections performed with a B0 field map obtained using an additional $\Delta$B0 acquisition. The single-acquisition B0 field estimation may have a duration similar to a duration of the dual-acquisition technique. However, the single-acquisition B0 field estimation is advantageous because the B0 field may be estimated offline (e.g. on a computer and without an additional image acquisition) with greater robustness to inter-scan motion and higher resolution. In one case, the duration of estimating the B0 field map may be further reduced by applying the low-pass filter (e.g. described with respect to act 121) during the adjoint call (e.g. as described with respect to 103).

FIG. 6 illustrates an embodiment of a system 601 for medical imaging. The system 601 may include a processor 603, memory 605, a network adapter 607, an image sensor 609, and a display 611. The image sensor 609, display 611, processor 603, and memory 605 may be part of a medical imaging device, a computer, a server, a workstation, or another system for image processing patient image data.

Additional, different, or fewer components may be provided. For example, the image sensor 609 may be remote from the system 601. The image reconstruction and/or B0 field map estimation may be applied as standalone applications on the system 601 or a local device, or as a service deployed on network (e.g. cloud) architecture. As another example, a user input device (e.g., keyboard, buttons, sliders, dials, trackball, mouse, or other device) is provided for user manipulation of the patient image data.

The processor 603 may be a controller, control processor, general processor, digital signal processor, three-dimensional data processor, graphics processing unit, application specific integrated circuit, field programmable gate array, artificial intelligence processor, digital circuit, analog circuit, combinations thereof, or other now known or later developed device for processing image data. The processor 603 may be a single device, a plurality of devices, or a network of devices. For more than one device, parallel or sequential division of processing may be used. The processor 603 may operate pursuant to and may be configured by stored instructions, hardware, and/or firmware to perform various acts described herein. For example, the acts of FIGS. 1 and 2 may be stored as instructions and configure the processor 603 to perform or execute the acts of FIGS. 1 and 2.

The memory 605 may be an external storage device, RAM, ROM, database, and/or a local memory (e.g. a solid state drive or a hard drive). The same or different non-transitory computer readable media may be used for the instructions and other data. The memory 605 may be implemented using a database management system (DBMS) and may reside on a memory, such as a hard disk, RAM, or removable media. Additionally or alternatively, the memory 605 may be internal to the processor 603 (e.g. a cache). The memory 605 may store the MR data, phase maps, magnitude images, B0 field maps, reconstructed images, and/or computer program instructions. The data stored in the memory 605 may be accessible and retrievable by the processor 603 or another processor.

The instructions for implementing the MR image creation, MR image correction, and/or B0 field estimation processes, the methods, and/or the techniques discussed herein may be provided on non-transitory computer-readable storage media or memories, such as a cache, buffer, RAM, removable media, hard drive or other computer readable storage media (e.g., the memory 605). Computer readable storage media may include various types of volatile and nonvolatile storage media. The functions, acts, or techniques illustrated in the Figures or described herein may be executed in response to one or more sets of instructions stored in or on computer readable storage media. The functions, acts, or techniques may be independent of the particular type of instructions set, storage media, processor or processing strategy and may be performed by software, hardware, integrated circuits, firmware, micro code and the like, operating alone or in combination.

In one embodiment, the instructions may be stored on a removable media device for reading by local or remote systems. In other embodiments, the instructions may be stored in a remote location, for example, for transfer through a computer network. In yet other embodiments, the instructions may be stored within a given computer, CPU, GPU or system. Because some of the constituent system components and method steps depicted in the accompanying figures may be implemented in software, the actual connections between the system components (or the process steps) may differ depending upon the manner in which the present embodiments are programmed.

The network adapter 607 may be in communication with one or more wired or wireless networks. Via the adapter 607, data may be sent and received between the system 601 and other computers on the network. For example, MR data may be retrieved from a remote computer, remote storage, or remote MR imaging system via the adapter 607. In another example, a MR image may be sent to a remote computer (e.g. for storage or further processing) via the adapter 607.

The medical imaging device 609 may be a MR imager. For example, the medical imaging device may record data based on a magnetic field applied to an imaging volume. Though one medical imaging device 609 is shown, more than one medical imaging device 609 may be provided. The medical imaging device 609 may receive a patient. In this way, the MR data includes information about magnetic resonance of the patient in the imaging volume. The MR data captured by the medical imaging device 609 may be stored. For example, the image data may be stored in the memory 605 or in storage remote from the system 601.

The display 611 may be a CRT, LCD, projector, plasma, printer, tablet, smart phone or other now known or later developed display device for displaying the output, such as patient biographic data. In some cases, the display 611 may present visual or audiovisual output.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

We claim:

1. A method for creating a magnetic resonance (MR) image from MR data, the method comprising:
  receiving, by a processor, the MR data;
  applying, by the processor, a transform to the MR data, wherein a result of the applying is an image space representation of the MR data;
  applying, by the processor, a virtual coil combination method to the image space representation of the MR data,
  determining, by the processor, a wrapped phase map of the image space representation of the MR data, wherein the wrapped phase map is determined based on the virtual coil combination method applied to the image space representation of the MR data;
  obtaining, by the processor, an unwrapped phase map based on the wrapped phase map;
  scaling, by the processor, the unwrapped phase map into a B0 field map, the scaling based on only the influence of B0 field inhomogeneities on phases in the MR data;

reconstructing, by the processor, the MR image based on the MR data;
correcting, by the processor, the MR image based on the B0 field map; and
outputting, by the processor, the MR image.

2. The method of claim 1, further comprising:
determining, by the processor, a magnitude image based on the image space representation of the MR data.

3. The method of claim 2, further comprising:
applying, by the processor, a sum of squares operation to the image space representation of the MR data,
wherein the determining of the magnitude image is based on the sum of squares operation applied to the image space representation of the MR data.

4. The method of claim 2, wherein the obtaining of the unwrapped phase map is based on the magnitude image.

5. The method of claim 4, further comprising:
generating, by the processor, a mask image based on the magnitude image; and
applying, by the processor, the mask image to the B0 field map.

6. The method of claim 1, wherein the contribution of heating, motion, radio frequency pulse heterogeneities, coil sensitivities and eddy current, or a combination thereof to the phases in the MR data is unrepresented in the scaling.

7. The method of claim 1, wherein the MR data is received from a clinical acquisition, and
wherein the correcting of the MR image is based on the B0 field map of only the clinical acquisition.

8. The method of claim 1, wherein the scaling of the unwrapped phase map is based on an approximation of the B0 field map as $\Delta B0 = \varphi/2\pi\, TE$.

9. The method of claim 1, wherein the MR data is obtained from a non-Cartesian acquisition.

10. The method of claim 1, wherein the MR data is obtained with an echo time of at least 20 ms, a field strength of approximately 3 T, or a combination thereof.

11. The method of claim 1, further comprising:
applying, by the processor, a low-pass filter to the B0 field map, the low-pass filter removing signals beyond a frequency domain of the B0 field inhomogeneities.

12. The method of claim 1, wherein the transform is a non-uniform transform.

13. A medical imaging system comprising:
a magnetic resonance (MR) imager;
a processor; and
a memory, the memory storing instructions that, when executed, are operable to:
receive MR data from the MR imager;
apply a transform to the MR data, wherein a result of the applying is an image space representation of the MR data;
determine a wrapped phase map of the image space representation of the MR data;
obtain an unwrapped phase map by solving a Poisson equation weighted by a magnitude of a previously estimated image;
scale the unwrapped phase map into a B0 field map, the scaling disregarding effects on the MR data by artifact sources secondary to B0 field inhomogeneities;
reconstruct the MR image based on the MR data;
correct the MR image based on the B0 field map; and
output the MR image.

14. The medical imaging system of claim 13, wherein the memory stores further instructions that, when executed, are operable to:
apply a virtual coil combination method to the image space representation of the MR data, and
wherein the wrapped phase map is determined based on the virtual coil combination method applied to the image space representation of the MR data.

15. The medical imaging system of claim 13, wherein the memory stores further instructions that, when executed, are operable to:
determine a magnitude image based on the image space representation of the MR data.

16. The medical imaging system of claim 15, wherein the memory stores further instructions that, when executed, are operable to:
apply a sum of squares operation to the image space representation of the MR data,
wherein the magnitude image is determined based on the sum of squares operation applied to the image space representation of the MR data.

17. The medical imaging system of claim 15, wherein the unwrapped phase map is further obtained based on the magnitude image.

18. The medical imaging system of claim 17, wherein the memory stores further instructions that, when executed, are operable to:
generate a mask image based on the magnitude image; and
apply the mask image to the B0 field map.

19. A non-transitory computer-readable medium storing processor-executable process steps, the process steps executable by a processor to cause a system to:
receive clinical MR data from the MR imager;
apply a transform to the clinical MR data, wherein a result of the applying is an image space representation of the clinical MR data;
determine a wrapped phase map of the image space representation of the MR data by applying a virtual coil combination method to the image space representation of the MR data;
obtain an unwrapped phase map based on the wrapped phase map;
scale the unwrapped phase map into a B0 field map according to a linear relationship between B0 and echo time;
reconstruct the MR image based on the clinical MR data;
correct the MR image based on the B0 field map; and
output the MR image.

* * * * *